(12) United States Patent
Ikeda et al.

(10) Patent No.: US 12,261,025 B2
(45) Date of Patent: Mar. 25, 2025

(54) PLASMA PROCESSING APPARATUS

(71) Applicant: Tokyo Electron Limited, Tokyo (JP)

(72) Inventors: Taro Ikeda, Nirasaki (JP); Satoru Kawakami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 59 days.

(21) Appl. No.: 18/256,683

(22) PCT Filed: Dec. 7, 2021

(86) PCT No.: PCT/JP2021/044877
§ 371 (c)(1),
(2) Date: Jun. 9, 2023

(87) PCT Pub. No.: WO2022/138130
PCT Pub. Date: Jun. 30, 2022

(65) Prior Publication Data
US 2024/0038500 A1 Feb. 1, 2024

(30) Foreign Application Priority Data
Dec. 21, 2020 (JP) .................... 2020-211851

(51) Int. Cl.
*H01J 37/32* (2006.01)
*C23C 16/455* (2006.01)
*C23C 16/50* (2006.01)
*H01L 21/02* (2006.01)

(52) U.S. Cl.
CPC .. *H01J 37/32449* (2013.01); *H01J 37/32174* (2013.01); *H01J 37/32715* (2013.01); *H01L 21/02274* (2013.01); *H01J 2237/334* (2013.01)

(58) Field of Classification Search
None
See application file for complete search history.

(56) References Cited

U.S. PATENT DOCUMENTS

2019/0180984 A1* 6/2019 Ikeda ................. H01J 37/3244

FOREIGN PATENT DOCUMENTS

| JP | H11-162957 A | 6/1999 |
| JP | H11-204295 A | 7/1999 |
| JP | 2020-092033 A | 6/2020 |
| KR | 10-2015-0128841 A | 11/2015 |
| KR | 10-2018-0125481 A | 11/2018 |

* cited by examiner

*Primary Examiner* — Alexander M Weddle
(74) *Attorney, Agent, or Firm* — Armstrong Teasdale LLP

(57) ABSTRACT

A plasma processing apparatus includes: a shower head provided above a substrate supporter; a gas supply pipe extending vertically above a chamber to be connected to an upper center of the shower head; an introducer through which the gas supply pipe passes and into which an electromagnetic wave of a VHF or higher is introduced to activate a gas; and an electromagnetic-wave supply path connected to the gas supply pipe. The introducer has a first dissociation space arranged upstream of the shower head and to which a first gas is supplied. The chamber has a second dissociation space between the substrate supporter and the shower head. The first gas dissociated in the first dissociation space and a second gas from the gas supply pipe are joined in the second dissociation space where they are dissociated by a radio-frequency wave having a frequency lower than that of the electromagnetic wave.

20 Claims, 10 Drawing Sheets

PLASMA PROCESSING APPARATUS

CROSS-REFERENCE TO RELATED APPLICATIONS

The present application is a U.S. National Stage Entry of International Patent Application No. PCT/JP2021/044877, filed Dec. 7, 2021, which claims the benefit of priority to Japanese Patent Application No. 2020-211851, filed Dec. 21, 2020, each of which is hereby incorporated herein by reference in its entirety.

TECHNICAL FIELD

The present disclosure relates to a plasma processing apparatus.

BACKGROUND

Patent Document 1 proposes a plasma CVD apparatus including a plasma generation chamber sandwiched between a radio-frequency applying electrode and an intermediate mesh plate electrode for plasma separation which are parallel to each other, and a counter electrode located outside the plasma generation chamber and by which a substrate is placed parallel to the intermediate mesh plate electrode. In Patent Document 1, the intermediate mesh plate electrode is movable in both directions toward the counter electrode and the radio-frequency applying electrode, and a radio-frequency wave may be applied to the counter electrode.

Patent Document 2 proposes a plasma processing apparatus for generating plasma from a gas by introducing VHF waves therein. In Patent Document 2, an upper electrode and a lower electrode have recesses formed in respective surfaces facing each other. An upper dielectric and a lower dielectric are provided in respective recesses of the upper electrode and the lower electrode. A VHF wave introducer is provided at a lateral end portion of a space between the upper dielectric and the lower dielectric.

Patent Document 3 proposes a plasma processing apparatus for generating plasma from a gas by introducing microwaves therein.

PRIOR ART DOCUMENTS

Patent Documents

Patent Document 1: Japanese Laid-Open Patent Publication No. H11-162957
Patent Document 2: Japanese Laid-Open Patent Publication No. 2020-092033
Patent Document 3: Japanese Laid-Open Patent Publication No. H11-204295

The present disclosure provides a plasma processing apparatus that can improve uniformity of a plasma process.

SUMMARY

According to one embodiment of the present disclosure, there is provided a plasma processing apparatus including: a chamber; a substrate supporter provided within the chamber and on which a substrate as a processing target is placed; a shower head formed of a metal and including a plurality of gas holes provided to be open toward an internal space of the chamber, the shower head being provided above the substrate supporter; a gas supply pipe formed of a metal and extending vertically above the chamber to be connected to an upper center of the shower head; an introducer through which the gas supply pipe passes above the chamber and into which an electromagnetic wave of a VHF or higher is introduced to activate a gas; and an electromagnetic-wave supply path connected to the gas supply pipe, wherein the introducer has a first dissociation space arranged upstream of the shower head, and a first gas is supplied to the first dissociation space to be dissociated in the first dissociation space by the electromagnetic wave; wherein the chamber has a second dissociation space which is a process space between the substrate supporter and the shower head, the first gas dissociated in the first dissociation space and a second gas from the gas supply pipe are joined in the second dissociation space downstream of the shower head, and the first gas and the second gas are dissociated in the second dissociation space by a radio-frequency wave having a frequency lower than a frequency of the electromagnetic wave; and wherein a cross-sectional shape of the first dissociation space is a substantially cylindrical shape, and a diameter of the substantially cylindrical shape of the first dissociation space is smaller than $\lambda g/6$ where $\lambda g$ is an effective wavelength of the electromagnetic wave in vacuum.

According to one aspect, it is possible improve uniformity of a plasma process.

DETAILED DESCRIPTION

Figure 1:
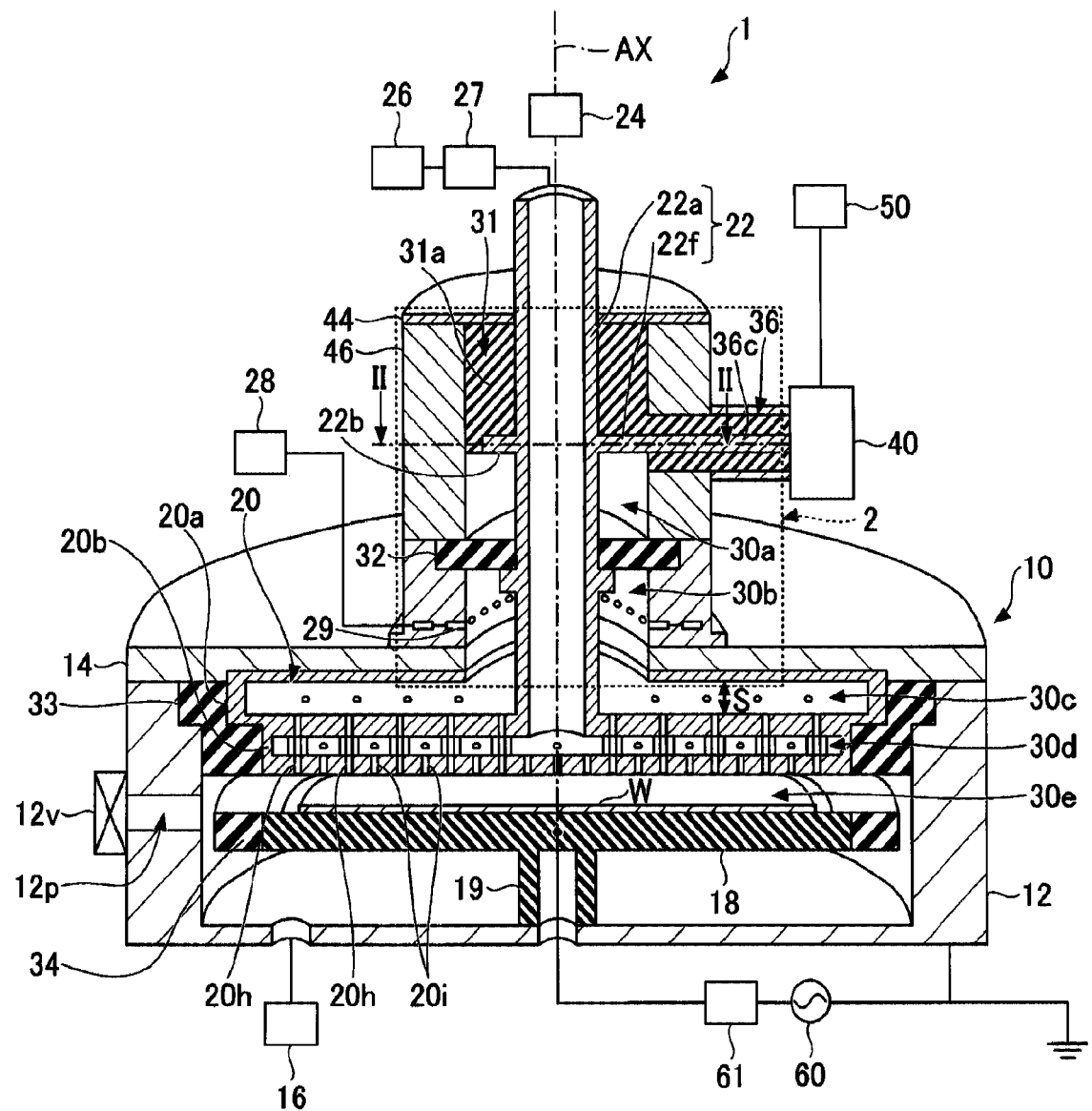
FIG. 1 is a schematic cross-sectional view illustrating an example of a plasma processing apparatus according to a first embodiment.

Hereinafter, embodiments for carrying out the present disclosure will be described with reference to the drawings. In each drawing, the same reference numerals will be given to the same components, and redundant descriptions thereof may be omitted.

In one exemplary embodiment, a plasma processing apparatus is provided. The plasma processing apparatus includes a chamber, a substrate supporter, a shower head, a gas supply pipe, an introducer, and an electromagnetic-wave supply path. The substrate supporter is provided within the chamber, and a substrate as a processing target is placed on the substrate supporter. The shower head is formed of a metal. The shower head includes a plurality of gas holes that are open toward an internal space of the chamber, and is provided above the substrate supporter. The gas supply pipe is formed of a metal. The gas supply pipe extends vertically above the chamber and is connected to an upper center of the shower head.

The introducer is provided on an upper surface of a top cover of the chamber, and the gas supply pipe passes through the gas introducer. The introducer is configured to introduce an electromagnetic wave of a VHF or higher to activate a gas. The electromagnetic-wave supply path is connected to the gas supply pipe. The gas supply pipe includes an annular flange portion. The electromagnetic-wave supply path includes a conductor connected to the flange portion.

The introducer has a first dissociation space. The first dissociation space is arranged upstream of the shower head. A first gas is supplied to the first dissociation space. The first gas is dissociated in the first dissociation space by the electromagnetic wave. The chamber has a second dissociation space. The second dissociation space is a process space within the chamber. The second dissociation space is a process space between the substrate supporter and the shower head. The first gas dissociated in the first dissociation space and a second gas from the gas supply pipe are introduced into the second dissociation space from a lower surface of the shower head, and are joined with each other in the second dissociation space at the downstream side of the shower head. In the second dissociation space, the first gas and the second gas are dissociated by a radio-frequency wave having a frequency lower than the VHF or higher of the electromagnetic wave.

A traverse sectional-view shape of the first dissociation space is a substantially cylindrical shape, and a diameter of the substantially cylindrical shape of the first dissociation space is smaller than λg/6, where λg is an effective wavelength of the electromagnetic wave of the VHF or higher in a vacuum space.

Hereinafter, various exemplary embodiments will be described in detail with reference to the drawings. As a method for increasing the performance of a plasma processing apparatus, a method of increasing a frequency can be considered. In this case, it is conceivable to use VHF waves or UHF waves, which have a frequency higher than that of general radio-frequency waves (e.g., 13.56 MHz). Due to the high frequency of VHF waves or UHF waves, this may control a gas, which is difficult to be dissociated by general radio-frequency waves, to be highly dissociated, and may enhance the performance of the plasma processing apparatus 1. However, when VHF waves or UHF waves are introduced into the chamber, the wavelength of such electromagnetic waves become shorter than that of general radio-frequency waves, which deteriorates the uniformity of plasma. This makes it difficult to uniformly perform processes such as film formation and etching.

In a plasma processing apparatus described below, a first dissociation space, which is a plasma generation space separated from a process space (second dissociation space) within the chamber, is provided independently above the chamber, so as not to deteriorate the uniformity of plasma when a gas is dissociated by electromagnetic waves such as VHF waves or UHF waves. Thus, there is provided a plasma processing apparatus capable of promoting uniformity of a plasma process using electromagnetic waves of a VHF or higher.

First Embodiment

[Plasma Processing Apparatus]

Figure 2:
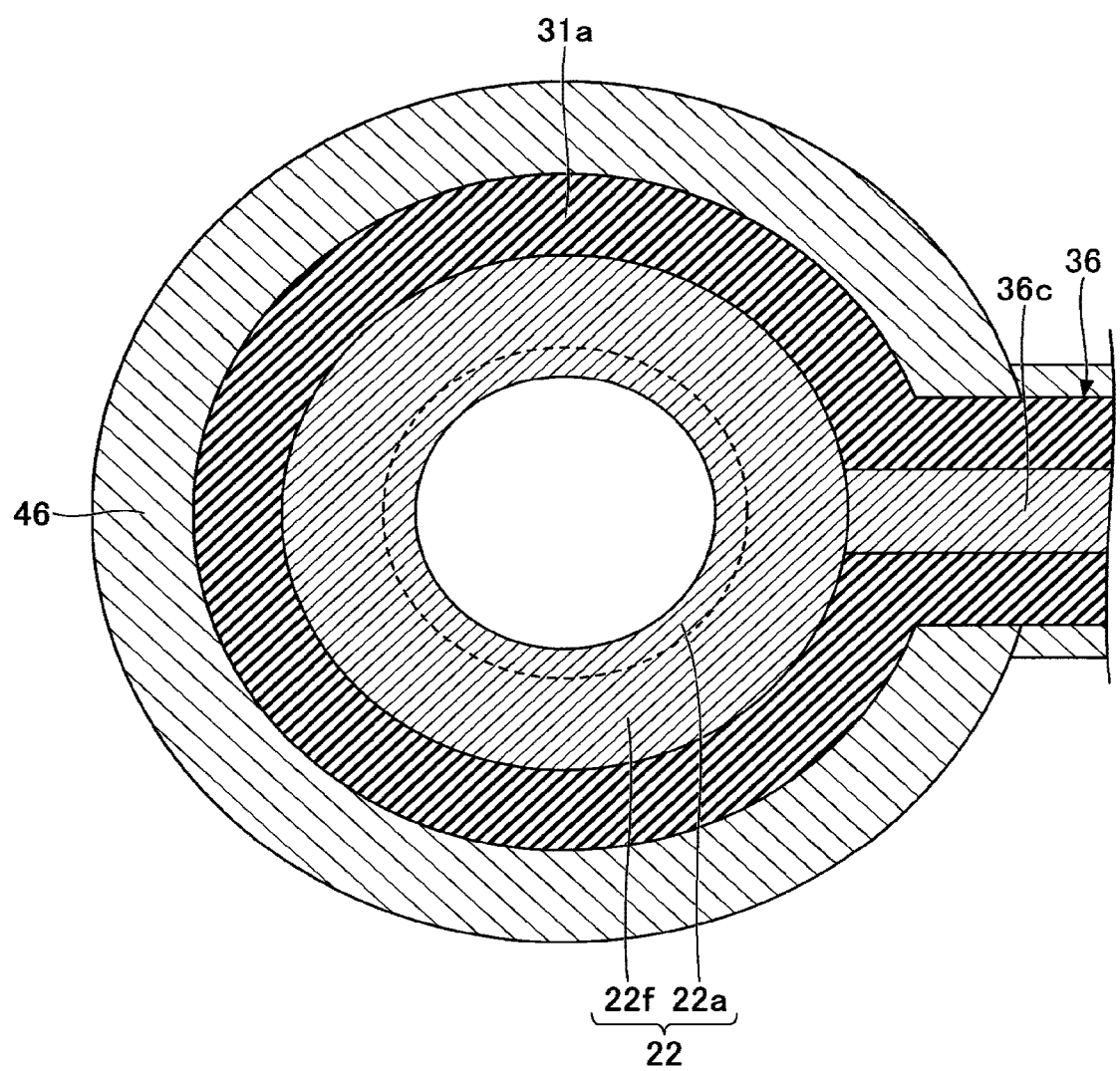
FIG. 2 is a cross-sectional view taken along line II-II in FIG. 1.
Figure 3:
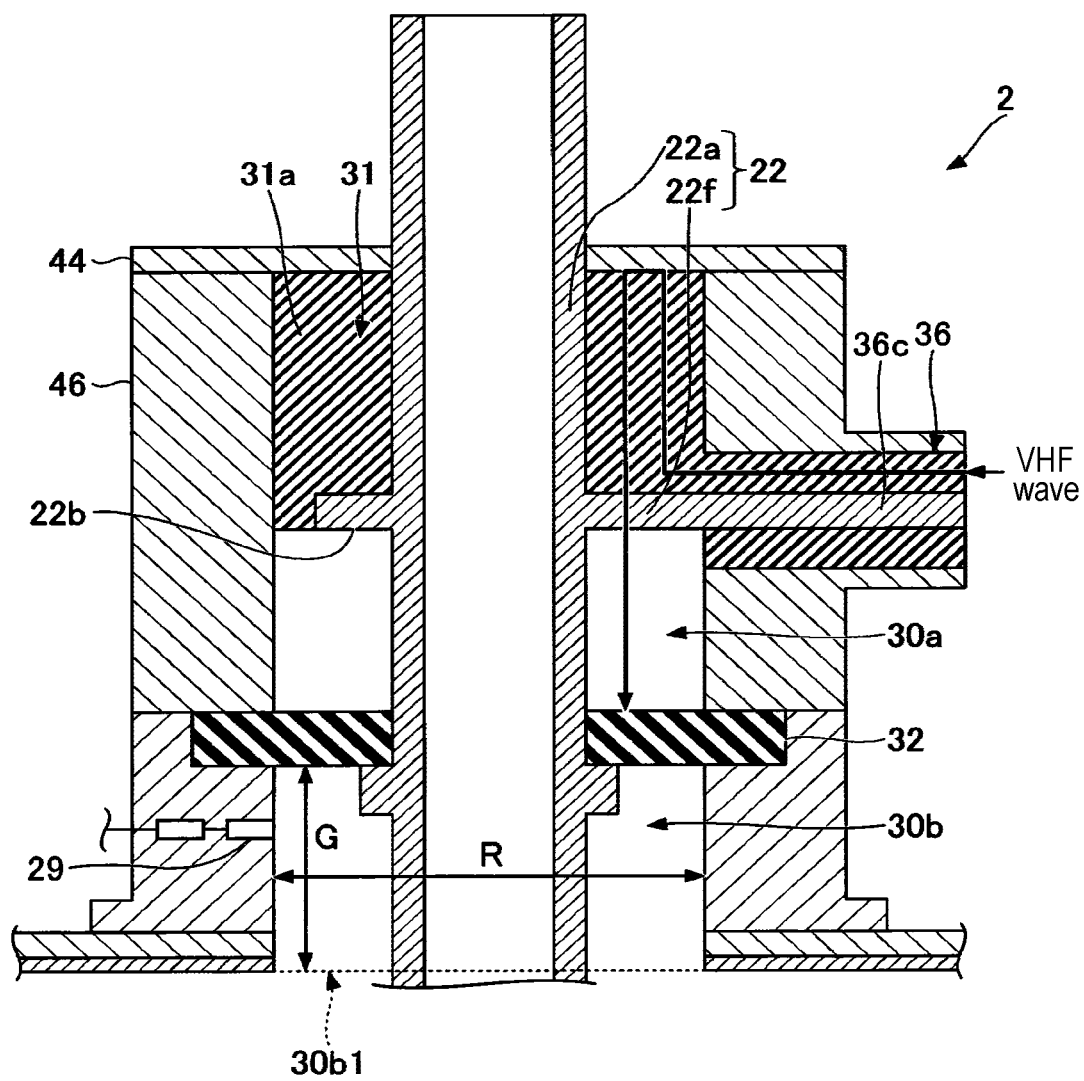
FIG. 3 is an enlarged view of a cross section of an introducer according to the first embodiment.

First, a plasma processing apparatus 1 according to a first embodiment will be described with reference to FIGS. 1 to 3. FIG. 1 is a schematic cross-sectional view illustrating an example of the plasma processing apparatus 1 according to the first embodiment. FIG. 2 is a cross-sectional view taken along line II-II in FIG. 1. FIG. 3 is an enlarged view of a cross section of an introducer according to the first embodiment.

The plasma processing apparatus 1 illustrated in FIG. 1 is configured to generate plasma from a gas by electromagnetic waves. The electromagnetic waves have a frequency equal to or higher than that of VHF waves, and include VHF waves and UHF waves. A frequency band of VHF waves is 30 MHz to 300 MHz, and a frequency band of UHF waves is 300 MHz to 3 GHz. More specifically, the electromagnetic waves may be VHF waves or UHF waves having a frequency of 150 MHz or higher.

The plasma processing apparatus 1 includes a chamber 10. The chamber 10 has an internal space defined therein. A substrate W is processed in the internal space of the chamber 10. The chamber 10 has an axial line AX as a central axis thereof. The axial line AX is a vertically-extending axial line.

In one embodiment, the chamber 10 may include a chamber main body 12. The chamber main body 12 has a substantially cylindrical shape and is open at the top thereof. The chamber main body 12 provides a sidewall and bottom of the chamber 10. The chamber main body 12 is formed of a metal such as aluminum. The chamber main body 12 is grounded.

A sidewall of the chamber main body 12 provides a passage 12p. The substrate W passes through the passage 12p when being transferred into and out of the chamber 10. The passage 12p may be opened and closed by a gate valve 12v. The gate valve 12v is provided along the sidewall of the chamber main body 12.

The chamber 10 may further include a top wall 14. The top wall 14 is formed of a metal such as aluminum. The top wall 14 closes the opening of the top of the chamber main body 12. The top wall 14 is grounded together with the chamber main body 12.

The bottom of the chamber 10 provides an exhaust port. The exhaust port is connected to an exhaust device 16. The exhaust device 16 includes a pressure controller such as an automatic pressure control valve, and a vacuum pump such as a turbo molecular pump.

The plasma processing apparatus 1 further includes a substrate supporter 18. The substrate supporter 18 is provided within the chamber 10. The substrate supporter 18 is configured to support the substrate W placed thereon. The substrate W is placed on the substrate supporter 18 in a substantially horizontal posture. The substrate supporter 18 may be supported by a support member 19. The support member 19 extends upward from the bottom of the chamber 10. The substrate supporter 18 and the support member 19 may be formed of a dielectric such as an aluminum nitride.

The plasma processing apparatus 1 further includes a shower head 20. The shower head 20 is formed of a metal such as aluminum. The shower head 20 has a substantially disk shape and has a hollow structure. The shower head 20 shares the axial line AX as the central axis thereof. The shower head 20 is provided above the substrate supporter 18 and below the top wall 14. The shower head 20 constitutes a ceiling portion defining the internal space of the chamber 10. An upper portion of the shower head 20 is fitted into the top wall 14.

The shower head 20 provides a plurality of first gas holes 20h and a plurality of second gas holes 20i. The plurality of first gas holes 20h and the plurality of second gas holes 20i are open at a lower surface of the shower head 20. A gas is introduced toward a process space between the shower head 20 and the substrate supporter 18 within the chamber 10. The process space between the shower head 20 and the substrate supporter 18 is also referred to as a "second dissociation space 30e."

The shower head 20 further provides a first diffusion chamber 30c and a second diffusion chamber 30d therein. The shower head 20 includes an upper stage section 20a, which constitutes an upper stage of the shower head 20 and includes the first diffusion chamber 30c therein, and a lower stage section 20b, which constitutes a lower stage of the shower head 20 and includes the second diffusion chamber 30d therein. Thus, the shower head 20 forms a first gas path, through which a first gas is introduced from the first diffusion chamber 30c, which constitutes the upper stage of the shower head 20, into the second dissociation space 30e as the process space, via the plurality of first gas holes 20h. Further, the shower head 20 forms a second gas path, through which a second gas is introduced from the second diffusion chamber 30d into the second dissociation space 30e via the plurality of second gas holes 20i. Further, the first gas path and the second gas path may be configured independently of each other such that they are not joined with each other before being introduced into the second dissociation space 30e.

The plasma processing apparatus 1 further includes an introducer 2. The introducer 2 includes a substantially cylindrical housing 46 formed of a metal such as aluminum and has a hollow structure. The housing 46 shares the axial line AX as the central axis thereof. A lower end of the introducer 2 is fixed on the top wall 14 of the chamber 10.

An upper end of the introducer 2 is closed by a disk-shaped cover conductor 44 having the same diameter as an outer diameter of the housing 46. The cover conductor 44 is formed of a metal such as aluminum. A gas flow path 29 is formed in a lower sidewall of the housing 46. The gas flow path 29 is connected to a first gas source 28 via a gas line. Details of a structure and function of the introducer 2 will be described later.

The gas flow path 29 includes gas holes evenly arranged in the circumferential direction on the sidewall of the housing 46, and supplies the first gas from the first gas source 28 to the shower head 20 via a hollow space of the introducer 2. The first gas is a reducing gas, and may be a $N_2$ gas, a $H_2$ gas, a $NH_3$ gas or the like. The first gas is introduced from the plurality of first gas holes 20h into the chamber 10 via the first diffusion chamber 30c. The plurality of first gas holes 20h extend downward from the first diffusion chamber 30c and connect the first diffusion chamber 30c to the second dissociation space 30e via a gas pipe passing through the second diffusion chamber 30d. The plurality of first gas holes 20h are not in communication with the second diffusion chamber 30d, and do not supply the first gas to the second diffusion chamber 30d, but supply the first gas to the second dissociation space 30e. Accordingly, the first gas is not joined, in the second diffusion chamber 30d, with the second gas supplied to the second diffusion chamber 30d.

The plasma processing apparatus 1 further includes a gas supply pipe 22. The gas supply pipe 22 is a substantially cylindrical pipe. The gas supply pipe 22 is formed of a metal such as aluminum. The gas supply pipe 22 extends vertically above the shower head 20. The gas supply pipe 22 shares the axial line AX as the central axis thereof. The gas supply pipe 22 passes through the cover conductor 44 and the housing 46.

A lower end of the gas supply pipe 22 is connected to an upper center of the shower head 20. The upper center of the shower head 20 provides a gas inlet. The inlet is connected to the second diffusion chamber 30d. The gas supply pipe 22 supplies the second gas to the shower head 20. The plurality of second gas holes 20i are not connected to the first diffusion chamber but are connected to the second diffusion chamber 30d, and extend downward from the second diffusion chamber 30d to supply the gas to the second dissociation space 30e. The second gas from the gas supply pipe 22 is introduced into the chamber 10 from the plurality of second gas holes 20i via the inlet of the shower head 20 and the second diffusion chamber 30d.

In one embodiment, the plasma processing apparatus 1 may further include a second gas source 24, a third gas source 26, and a remote plasma source 27. The gas supply pipe 22 passes through the introducer 2 (resonator 31) and functions as a pipe for supplying the second gas or a pipe for remote plasma.

The second gas source 24 is connected to the gas supply pipe 22. The second gas source 24 may be a gas source of a film formation gas. The film formation gas is an example of the second gas and is a gas that is not intended to be dissociated excessively. The film formation gas may include a silicon-containing gas. The silicon-containing gas includes, for example, a silane gas ($SiH_4$). The film formation gas may further include other gases. For example, the film formation gas may further include a $NH_3$ gas, a $N_2$ Gas, a noble gas such as Ar, and the like. The gas (e.g., the film formation gas) from the second gas source 24 is introduced into the second dissociation space 30e within the chamber 10 from the shower head 20 via the gas supply pipe 22.

The third gas source 26 is connected to the gas supply pipe 22 via the remote plasma source 27. The third gas source 26 may be a gas source of a cleaning gas. The cleaning gas is an example of a third gas. The cleaning gas may include a halogen-containing gas. The halogen-containing gas includes, for example $NF_3$ and/or $Cl_2$. The cleaning gas may further include other gases. The cleaning gas may further include a noble gas such as Ar.

The remote plasma source 27 excites the gas from the third gas source 26 to generate plasma at a location spaced apart from the chamber 10. In one embodiment, the remote plasma source 27 generates plasma from the cleaning gas. The remote plasma source 27 may be any type of plasma source. Examples of the remote plasma source 27 include a capacitively coupled plasma source, an inductively coupled plasma source, and a plasma source that generates plasma using microwaves. Radicals in the plasma generated in the remote plasma source 27 are introduced into the second dissociation space 30e from the shower head 20 via the gas supply pipe 22. In order to prevent deactivation of the radicals, the gas supply pipe 22 may have a relatively large diameter. The outer diameter (diameter) of the gas supply pipe 22 may be 40 mm or more. In one example, the outer diameter (diameter) of the gas supply pipe 22 is mm. In addition, the outer diameter (diameter) of the gas supply pipe 22 is the outer diameter of the gas supply pipe 22 in a portion 22a other than a flange portion 22f In this way, the cleaning gas is supplied from the gas supply pipe 22 to the second dissociation space 30e within the chamber 10 in a state of being dissociated in advance in the remote plasma source 27. For this reason, it is not necessary to dissociate the cleaning gas in the second dissociation space within the chamber 10.

Outer peripheries of the upper stage section 20a and the lower stage section 20b of the shower head 20 are covered with a member 33 made of a dielectric such as an aluminum oxide. An outer periphery of the substrate supporter 18 is covered with a member 34 made of a dielectric such as an aluminum oxide. When no radio frequency power is applied to the shower head 20, the dielectric member 33 may be omitted. However, the dielectric member 33 may be arranged in order to determine an area of the shower head 20 that will function as a counter electrode of the substrate supporter 18. Further, the dielectric member 33 may also be arranged in order to make an anode-to-cathode ratio of the electrode as even as possible.

A radio-frequency power supply 60 is connected to the substrate supporter 18 via a matcher 61. The matcher 61 includes an impedance matching circuit. The impedance matching circuit is configured to match a load-side impedance of the radio-frequency power supply 60 to an output impedance of the radio-frequency power supply 60. A frequency of radio-frequency waves supplied from the radio-frequency power supply 60 is lower than that of VHF waves supplied from a VHF power supply 50, and is 60 MHz or lower. An example of the frequency of the radio-frequency waves may be a frequency of 13.56 MHz in a process in which the influence of ion energy does not need to be considered so much, such as a process of forming a multilayered film composed of oxide and nitride films.

[Introducer]

Next, a configuration of the introducer 2 will be described with reference to FIG. 2 together with FIG. 1. FIG. 2 is a cross-sectional view taken along line II-II in FIG. 1. The gas supply pipe 22 includes the flange portion 22f having an annular shape in a longitudinal portion thereof. The flange portion 22f radially protrudes from the other portion 22a of the gas supply pipe 22.

The plasma processing apparatus 1 further includes an electromagnetic-wave supply path 36. The supply path 36 includes a conductor 36c. The conductor 36c of the supply path 36 is connected to the gas supply pipe 22. Specifically, one end of the conductor 36c is connected to the flange portion 22f.

The other end of the conductor 36c is connected to the VHF power supply 50 via a matcher 40. The VHF power supply 50 is an electromagnetic-wave generator. VHF waves are described herein by way of example as the electromagnetic waves output from the VHF power supply 50, but the electromagnetic waves may be UHF waves.

The matcher 40 includes an impedance matching circuit. The impedance matching circuit is configured to match a load-side impedance of the VHF power supply 50 to an output impedance of the VHF power supply 50. The impedance matching circuit has a variable impedance. The impedance matching circuit may be, for example, a π-type circuit.

The VHF waves introduced from the electromagnetic-wave supply path 36 into the introducer 2 resonate in the resonator 31 above the flange portion 22f within the housing 46, and are supplied with high energy efficiency to a first dissociation space 30b below the flange portion 22f. The interior of the resonator 31 is filled with a dielectric 31a. The dielectric 31a is provided to shorten the wavelength of VHF waves.

The dielectric 31a is formed of, for example, polytetrafluoroethylene (PTFE). A vertical position of a lower end of the dielectric 31a may be the same as a vertical position of a lower surface 22b of the flange portion 22f. In one embodiment, as illustrated in FIG. 1, an area between the lower surface 22b of the flange portion 22f and the cover conductor 44 in a space between the gas supply pipe 22 and the cover conductor 44 may be filled with the dielectric 31a. Additionally, a space 30a immediately below the resonator 31 may be filled with the dielectric 31a.

The interior of the resonator 31 is in an ambient atmosphere. A partition plate 32 made of a dielectric is provided below the flange portion 22f to partition between the resonator 31 and the first dissociation space 30b. The space 30a is provided between the partition plate 32 and the resonator 31. The space 30a may be omitted, or a longitudinal length of the space 30a may be shortened. This makes it possible to reduce the size of the introducer 2. The partition plate 32 may have an annular shape and may be formed of a dielectric such as an aluminum oxide. The first dissociation space 30b is provided below the partition plate 32. The first dissociation space 30b is partitioned by the partition plate 32 and is in vacuum.

A cross-sectional shape of the first dissociation space 30b is substantially cylindrical, and unevenness, deformation or the like thereof may be allowed within an allowable range of the distribution of plasma generated therein. The first dissociation space 30b has approximately the same diameter as an outer diameter of the resonator 31.

As illustrated by the arrows in FIG. 3, the VHF waves propagate from the electromagnetic-wave supply path 36 into the resonator 31, resonate within the resonator 31, and pass through the partition plate 32 below the flange portion 22f to thereby propagate to the first dissociation space 30b. The VHF waves resonating within the resonator 31 are supplied to the first dissociation space 30b with high energy efficiency, thus dissociating the first gas supplied from the gas flow path 29. Thus, plasma of the first gas is generated in the first dissociation space 30b. When the VHF waves are directly supplied to the shower head 20 to dissociate the gas within the shower head 20, the plasma tends to become non-uniform. In contrast, the first dissociation space 30b functions as a plasma generation space to generate surface wave plasma in the first dissociation space 30b, and highly dissociates the first gas by power of the VHF waves having a frequency higher than that of general RF waves.

According to this, the first dissociation space 30b functions as a plasma generation space to efficiently and sufficiently dissociate the first gas such as H radicals and N radicals before the first gas is supplied to the shower head 20. Thereafter, the radicals of the dissociated first gas are introduced into the shower head 20.

The second dissociation space 30e is a space in which the first gas dissociated in the first dissociation space 30b and the second gas passed through the gas supply pipe 22 are joined with each other to generate plasma of these gases. In the second dissociation space 30e, the first gas and the second gas are dissociated by radio frequency power having a frequency lower than that of the VHF waves supplied from the radio-frequency power supply 60.

An enlarged view of the introducer 2 is illustrated in FIG. 3. A diameter R of the substantially cylindrical shape of the first dissociation space 30b is smaller than $\lambda g/6$ where $\lambda g$ is the effective wavelength of VHF waves in vacuum. The first dissociation space 30b may be a substantially cylindrical space which is as small as possible. Accordingly, the diameter R of the substantially cylindrical shape of the first dissociation space 30b may more specifically be smaller than λg/8 where λg is the effective wavelength of VHF waves in vacuum.

In a normal vacuum space, it is necessary to set the diameter R of the substantially cylindrical shape to λg/2 or less in order to prevent the formation of nodes of VHF waves. In contrast, the effective wavelength of VHF waves in plasma is shortened to about ⅓ of the effective wavelength λg of VHF waves in normal vacuum. Since the first dissociation space 30b is a plasma generation space, the diameter R of the substantially cylindrical shape needs to be smaller than ⅓ of (λg/2), that is, λg/6, in order to prevent nodes of VHF waves from being formed in the radial direction in the first dissociation space 30b. Thus, the energy of VHF waves may be transmitted efficiently after eliminating the influence of anti-nodes or nodes.

When the field intensity of VHF waves propagating in the first dissociation space 30b is high, the Coulomb force acts and the gas is constrained by the Coulomb force, which inhibits the diffusion of the gas. Accordingly, in order to prevent the electric field of VHF waves reaching the first dissociation space 30b from affecting the diffusion of the gas, a distance G from a lower end 30b1 (imaginary line in FIG. 3) to an upper end (the lower surface of the partition plate 32) of the first dissociation space 30b may be about 10 mm. However, 10 mm is an example, and an appropriate value of the distance G depends on the frequency of VHF waves or UHF waves being supplied. Thus, the diffusion of the gas to the shower head 20 is not inhibited, and radicals of the first gas may be diffused from the first dissociation space 30b to the shower head 20.

A gap between the shower head 20 and the substrate supporter 18, which is the second dissociation space 30e, may be 3 mm to 30 mm.

In order to increase the generation efficiency of radicals of the first gas, it is conceivable to increase the frequencies of radio-frequency waves and electromagnetic waves in order to promote the dissociation of the first gas. Therefore, the plasma processing apparatus 1 uses VHF waves and promote the dissociation of the first gas by electromagnetic waves having a frequency higher than that of general RF waves. However, since the wavelength is shortened when the frequency is increased, antinodes or nodes of VHF waves exist in the first dissociation space 30b, which is a plasma generation space, from the relationship with the size of the chamber 10. Consequently, the distribution of plasma in the first dissociation space 30b becomes uneven due to the antinodes or nodes of VHF waves.

On the other hand, in the plasma processing apparatus 1 according to the present embodiment, the diameter R of the first dissociation space 30b, which is a plasma generation space in a first step, is made smaller than λg/6. Thus, anti-nodes and nodules of VHF waves are not formed in the first dissociation space 30b. This prevents an uneven distribution of plasma of the first gas generated in the first dissociation space 30b. As an example, in a case of electromagnetic waves of 860 MHz, the effective wavelength λg of electromagnetic waves in a vacuum space is 360 mm, so that the diameter R of the first dissociation space 30b satisfies the condition of λg/6=60 mm or less.

With such a configuration, electromagnetic waves in a band of a VHF or higher are supplied, and the resonator 31 is used to efficiently dissociate the first gas within the first dissociation space 30b. In this way, according to the plasma processing apparatus 1 of the first embodiment, plasma of the first gas is generated by pre-ignition of plasma in the first dissociation space 30b of the introducer 2 before the first gas is supplied to the shower head 20. At this time, the first gas is highly dissociated by electromagnetic waves such as VHF waves having a frequency higher than that of general RF waves, resulting in the efficient generation of radicals of the first gas.

Returning to FIG. 1, the first dissociation space 30b is in communication with the first diffusion chamber 30c of the shower head 20. The radicals of the first gas generated in the first dissociation space 30b are supplied to the second dissociation space 30e, which is a process space, via the first gas holes 20h of the shower head 20. By this first gas path, the radicals of the first gas may be uniformly supplied over the plane of the substrate W through the shower head 20.

The second gas supplied from the gas supply pipe 22 passes through the second diffusion chamber 30d and is supplied to the second dissociation space 30e via the second gas holes 20i of the shower head 20. By this second gas path, the second gas may be uniformly supplied over the plane of the substrate W via the shower head 20. Since the first gas path and the second gas path are different gas paths, a process gas and a reducing gas are not joined in any gas path so that particles are less likely to be generated, particularly when performing atomic layer deposition (ALD).

For example, in a process using a $SiH_4$ gas as the second gas, $SiH_3$ in a slightly dissociated state may be generated in the second dissociation space 30e and supplied onto the substrate W, thereby contributing to film formation. It is not desirable to supply $SiH_2$ or the like in a highly dissociated state onto the substrate W. Accordingly, in the second dissociation space 30e, the second gas is dissociated by power of radio-frequency waves having a frequency lower than that of VHF waves.

On the other hand, a reducing gas, which is the first gas, may contribute to film formation in a highly dissociated state as much as possible. In this regard, the first gas is sufficiently dissociated in the first dissociation space 30b by VHF waves having a frequency higher than that of general RF waves before being supplied to the shower head 20, and is supplied in a radical state to the second dissociation space 30e. In particular, the first dissociation space 30b is a donut-shaped plasma generation space and is easy to ensure the uniformity of plasma.

In this way, in the first step of plasma generation, the first gas is sufficiently dissociated using VHF waves in the first dissociation space 30b to increase the amount of radicals generated. In a second step of plasma generation, the radicals of the already-dissociated first gas and the second gas are supplied to the second dissociation space 30e, and film formation by plasma of the first gas and the second gas is performed while preventing the second gas from being highly dissociated by using radio-frequency waves having a frequency lower than that of VHF waves.

Monoatomic radicals (e.g., N radicals) of the first gas dissociated in the first step recombine to form a molecular gas (e.g., $N_2$ gas) or molecular radicals (e.g. $N_2$ radicals) while passing through the first gas path.

However, the first gas supplied to the second dissociation space 30e is in a recombination excited state since it is activated and/or dissociated in the first step. That is, in the first dissociation space 30b, even if the first gas is not highly dissociated by radio-frequency waves having a frequency lower than that of VHF waves, the molecular gas or the molecular radicals thereof when supplied to the second dissociation space 30e are in a state where they may be dissociated again by radio-frequency waves having a frequency lower than that of VHF waves. For example, when the first gas is $N_2$ molecules, the $N_2$ molecules which were dissociated once are highly likely to be in an excited state, that is, in the recombination excited state with a higher energy level than the ground state, and are easy to be dissociated again. Accordingly, since the first gas is in the recombination excited state, radicals of the first gas, which are equivalent to a case where plasma of the first gas is generated by VHF waves, may be generated even by radio-frequency waves such as general radio-frequency waves of 13.56 MHz, 27 MHz, and the like.

However, more particularly, the radicals of the first gas dissociated in the first step may be allowed to efficiently reach the substrate W as they are without recombination. This may be achieved by satisfying both conditions of: dissociating the first gas with VHF waves having a high frequency; and thinning the shower head 20 by reducing the distance S between the first dissociation space 30b and the shower head 20 (i.e., the height of the first diffusion chamber 30c). Thus, the amount of radicals reaching the substrate W may be increased.

Radicals such as H radicals and N radicals have a short lifespan. The longer the distance until the radicals generated in the first dissociation space 30b reach the second dissociation space 30e, the higher the probability of collision between the monoatomic radicals and the higher the probability of the radicals returning to molecules such as $H_2$ and $N_2$. On the other hand, in order to reduce the probability of collision between the monoatomic radicals, the distance S is provided such that the bottom surface of the first diffusion chamber 30c of the shower head 20 is located at a position 5 to 10 times a skin depth of plasma generated in the first dissociation space 30b.

The electric field of plasma is sufficiently attenuated at the position 5 to 10 times away from the skin depth of plasma generated in the first dissociation space 30b, so that gas diffusion and radical diffusion exceed the Coulomb force, which ensures sufficient diffusion. Accordingly, in the plasma processing apparatus 1, even if electromagnetic waves in a band of a VHF or higher are used, the radicals may easily reach the second dissociation space 30e without being affected by the distribution of electromagnetic waves in the first dissociation space 30b which is a plasma generation space.

The skin depth of plasma varies in value depending on (1) frequency, (2) electron density, and (3) collision frequency of electrons and neutral particles. Here, the collision frequency of electrons and neutral particles in (3) is determined by a gas species and an electron temperature. For example, when radio-frequency waves or electromagnetic waves having frequencies of 100 MHz or 200 MHz are applied under the electron density in (2) of $10^{10}$ (cm$^{-3}$) and the collision frequency of electrons and neutral particles in (3) of $3.6 \times 10^8$ (sec$^{-1}$), the skin depths are 5.7 mm and 4 mm, respectively. The smaller the skin depth, that is, the higher the frequency of electromagnetic waves, the more concentrated the current on the skin.

The skin depth $\delta$ is calculated by Equation (1).

$$\text{Skin depth} \delta = [2/(\omega \mu_0 \sigma_{dc})]^{1/2} \quad (1)$$

where $\omega$ is the power supply frequency, to is the vacuum permeability, and $\sigma_{dc}$ is the plasma conductivity. The plasma conductivity is calculated by Equation (2).

$$\text{Plasma conductivity} \sigma_{dc} = e^2 n_e/(m v_m) \quad (2)$$

where $\omega$ is the elementary charge, $n_e$ is the electron density, m is the electron mass, and $v_m$ is the collision frequency of electrons and neutral particles.

From the above, the vertical distance S between a ceiling surface and a bottom surface of the first diffusion chamber 30c within the shower head 20 may be within 10 times the skin depth $\delta$, and may range from 5 times to 10 times. Thus, the amount of radicals of the first gas reaching the second dissociation space 30e may be increased without constraint of gas diffusion and radical diffusion by the Coulomb force.

As described above, in the plasma processing apparatus 1, the shower head 20 pre-exists at a position 5 to 10 times the skin depth from the first dissociation space 30b which is a plasma generation space. For this reason, even if electromagnetic waves in a band of a VHF or higher are used, the gas or radicals in the shower head 20 are not affected by the distribution of electromagnetic waves in the first dissociation space 30b.

In addition, the diameters of the first gas holes 20h and the second gas holes 20i of the shower head 20 may be about 1 mm. The frequency of collision between radicals in the first gas holes 20h and the second gas holes 20i increases at diameters smaller than the diameter of about 1 mm. Thus, the probability of N radicals or $N_2$ radicals returning to $N_2$ molecules of the first gas before reaching the second dissociation space 30e can be reduced. This makes it possible to improve the uniformity of a plasma process.

In the plasma processing apparatus 1 described above, the first dissociation space 30b is provided as a plasma generation space upstream of the shower head 20, and the first gas such as a $N_2$ gas is dissociated to generate N monoatoms, N radicals, and the like in the first dissociation space 30b. When the generated radicals and the like reach the second dissociation space 30e through the shower head 20, some of them return from radicals to molecules, and some of them change from monoatomic radicals to molecular radicals. However, since the first gas reaching the second dissociation space 30e is in a recombination excited state, molecules and molecular radicals may be re-dissociated into monoatomic radicals by energy of radio-frequency waves having a frequency lower than that of VHF waves. Further, the second gas, which is a process gas, is supplied to the second dissociation space 30e through the shower head 20 by using the second gas path different from the first gas path of the first gas. The supplied second gas may be slightly dissociated in the second dissociation space 30e by energy of radio-frequency waves having a frequency lower than that of VHF waves. This makes it possible to improve the uniformity of a plasma process.

Modification of First Embodiment

Figure 4:
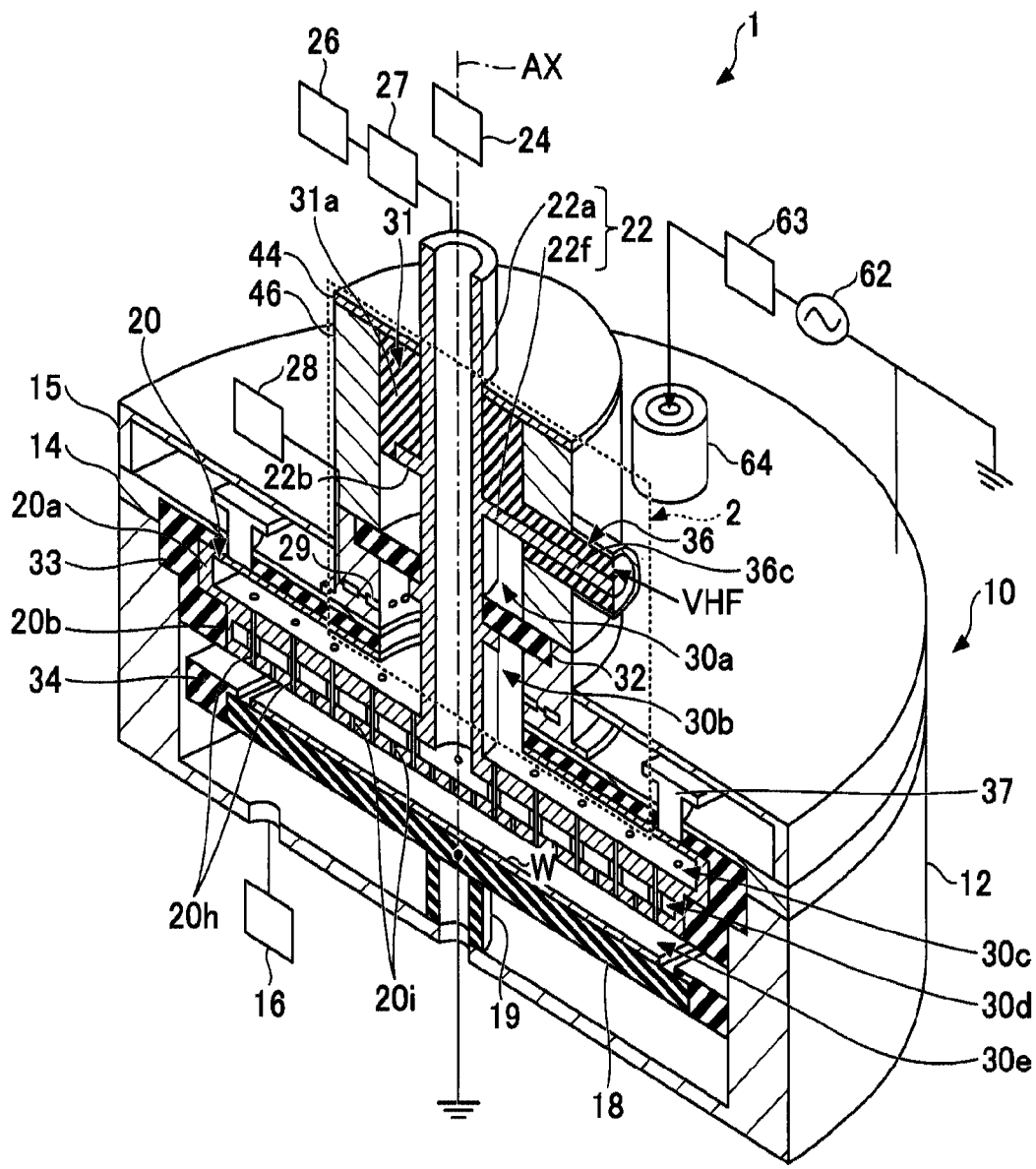
FIG. 4 is a cross-sectional perspective view illustrating Modification 1 of the plasma processing apparatus according to the first embodiment.
Figure 5:
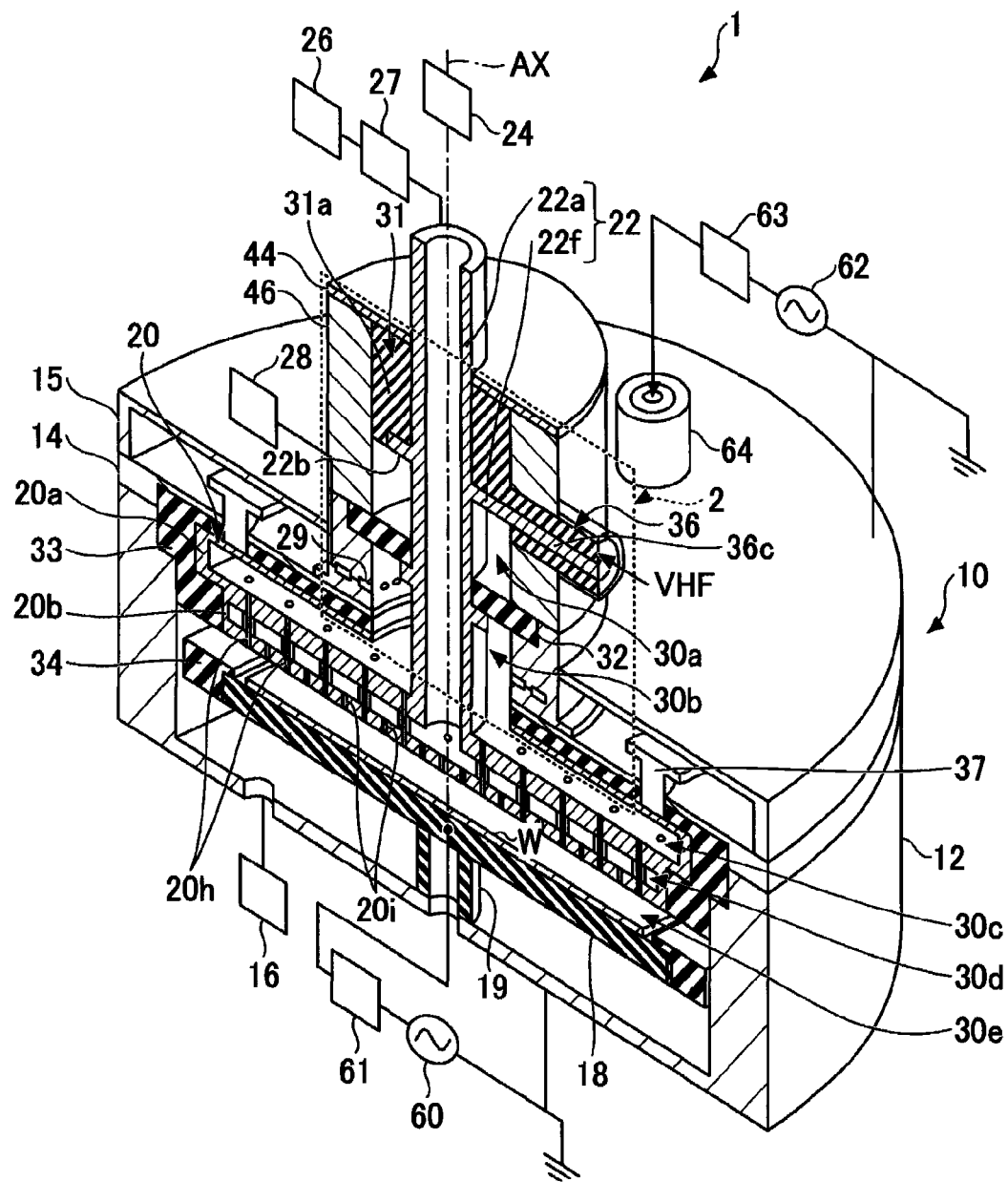
FIG. 5 is a cross-sectional perspective view illustrating Modification 2 of the plasma processing apparatus according to the first embodiment.

Next, Modifications 1 and 2 of the plasma processing apparatus 1 according to the first embodiment will be described with reference to FIGS. 4 and 5. FIG. 4 is a cross-sectional perspective view illustrating Modification 1 of the plasma processing apparatus 1 according to the first embodiment. FIG. 5 is a cross-sectional perspective view illustrating Modification 2 of the plasma processing apparatus 1 according to the first embodiment.

Modification 1 of First Embodiment

The plasma processing apparatus 1 of Modification 1 illustrated in FIG. 4 differs from the plasma processing apparatus 1 of FIG. 1 in that radio frequency power is applied to the shower head 20 and the substrate supporter 18 is at the ground potential. In Modification 1, the substrate supporter 18 is not connected to the radio-frequency power supply 60, but is connected to the ground.

Further, the plasma processing apparatus 1 of Modification 1 is provided with a disk-shaped connector 15 having a hollow structure above the top wall 14 of the chamber 10. The introducer 2 passes through the connector 15 and is fixed to the top wall 14. A junction 37, which comes into contact with the shower head 20, is provided within the connector 15.

A radio-frequency power supply 62 passes through the interior of an upper connector 64 of the connector 15 via a matcher 63 and is connected to the shower head 20 via the junction 37. Thus, radio-frequency waves having a frequency lower than that of VHF waves are applied to the shower head 20 via the junction 37. The outer periphery of the shower head 20 excluding the lower surface is covered with the dielectric member 33. Other configurations are the same as those of the plasma processing apparatus 1 illustrated in FIG. 1.

Modification 2 of First Embodiment

The plasma processing apparatus 1 of Modification 2 illustrated in FIG. 5 differs from the plasma processing apparatus 1 of Modification 1 illustrated in FIG. 4 in that radio frequency power is applied to both the shower head 20 and the substrate supporter 18. In Modification 2, the radio-frequency power supply 60 is connected to the substrate supporter 18 via the matcher 61.

Further, the radio-frequency power supply 62 is connected to the shower head 20 via the matcher 63 and the junction 37. Thus, radio-frequency waves having a frequency lower than that of VHF waves are applied to the substrate supporter 18 and the shower head 20.

Even with Modifications 1 and 2 of the plasma processing apparatus 1 according to the first embodiment, plasma of the first gas is generated in advance in the first dissociation space 30b, and radicals of the first gas in a recombination excited state reach the second dissociation space 30e. This makes it possible to dissociate the first gas in the second dissociation space 30e even by radio-frequency waves having a frequency lower than that of VHF waves, and also slightly dissociate the second gas. Thus, the uniformity of a plasma process can be improved.

Second Embodiment

Figure 6:
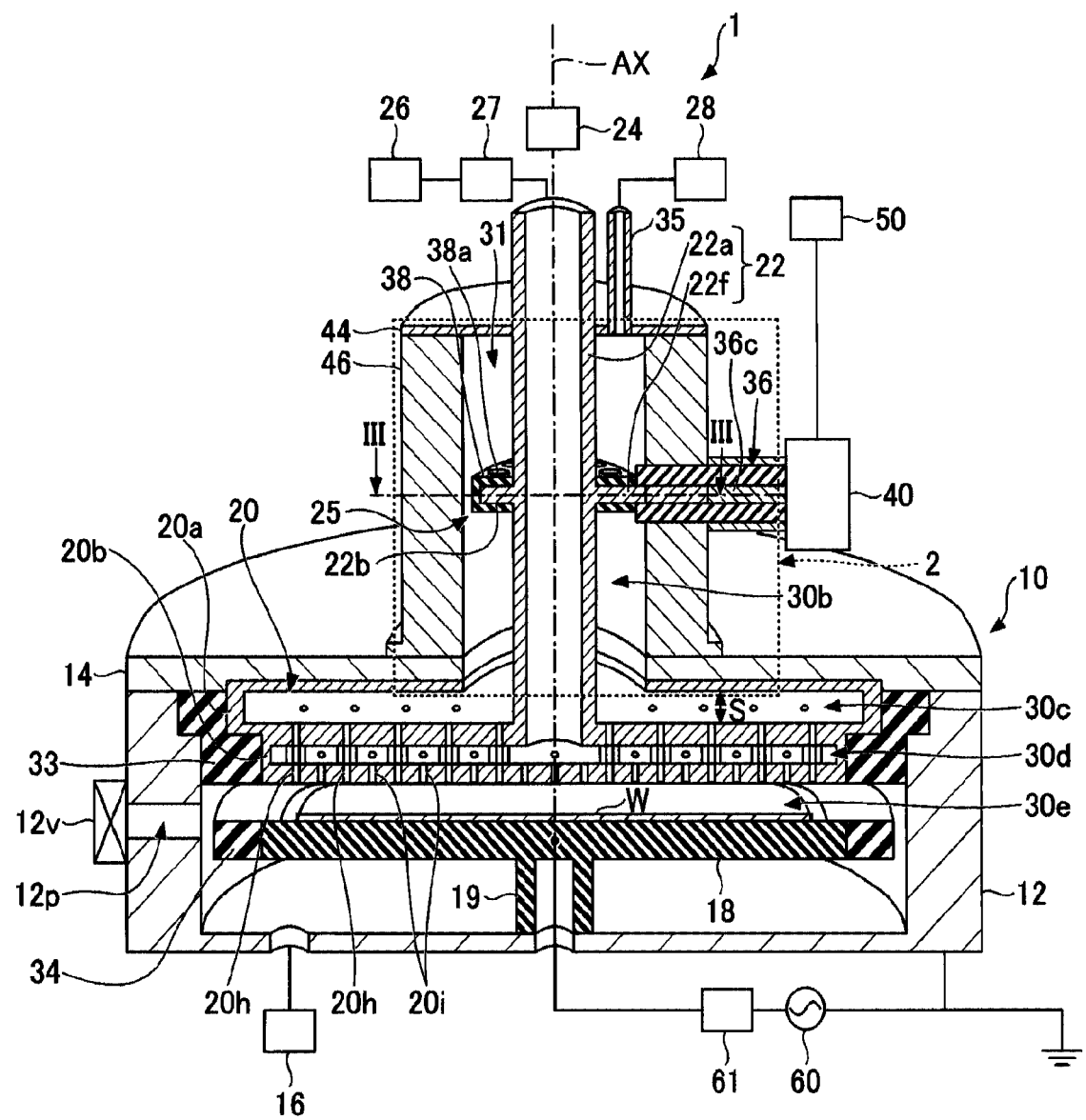
FIG. 6 is a schematic cross-sectional view illustrating an example of a plasma processing apparatus according to a second embodiment.
Figure 7:
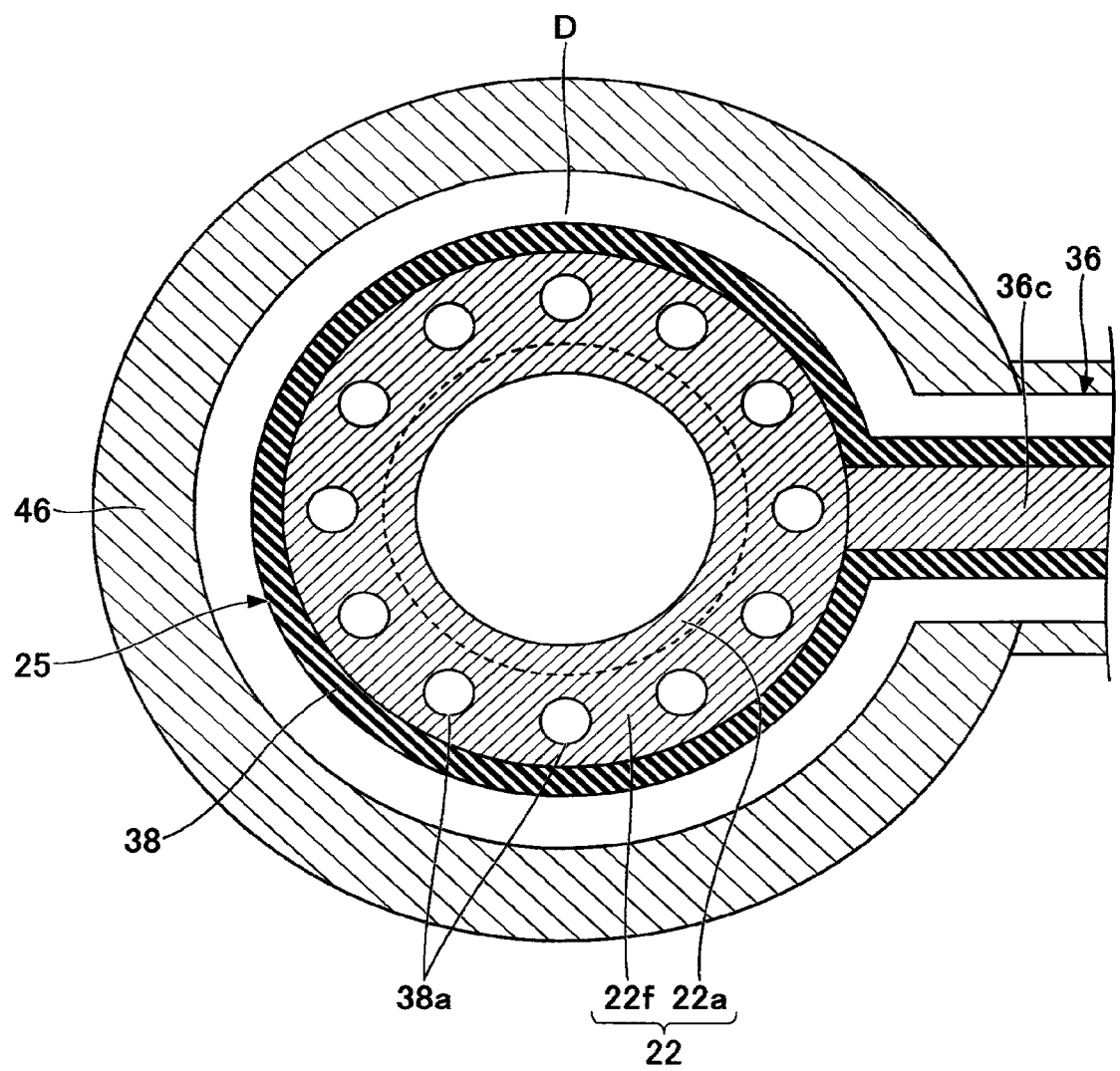
FIG. 7 is a cross-sectional view taken along line in FIG. 6.
Figure 8:
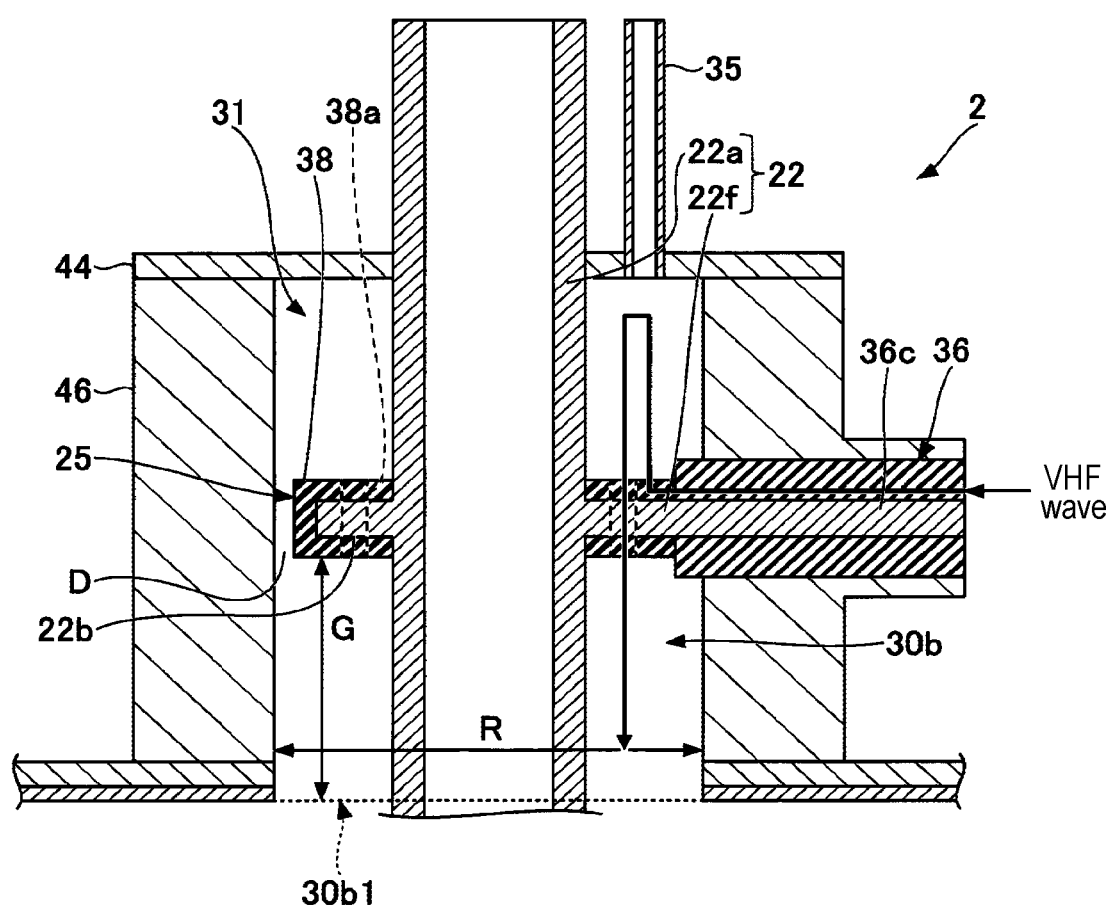
FIG. 8 is an enlarged view of a cross section of an introducer according to the second embodiment.

[Plasma Processing Apparatus]
Next, the plasma processing apparatus 1 according to a second embodiment will be described with reference to FIGS. 6 to 8. FIG. 6 is a schematic cross-sectional view illustrating an example of the plasma processing apparatus 1 according to the second embodiment. FIG. 7 is a cross-sectional view taken along line in FIG. 6. FIG. 8 is an enlarged view of a cross section of the introducer 2 according to the second embodiment.

The plasma processing apparatus 1 according to the second embodiment differs from the plasma processing apparatus 1 according to the first embodiment in a configuration of the introducer 2, and other configurations are the same. Accordingly, the configuration of the introducer 2 will be described below.

In the introducer 2 according to the present embodiment, the interior of the resonator 31 which propagates VHF waves is in vacuum, and also functions as a first dissociation space. In the second embodiment, the entire interior of the introducer 2 is the first dissociation space. That is, the internal space of the resonator 31 above the flange portion 22f and the space 30b below the flange portion 22f are the first dissociation space and serve as a plasma generation space.

The resonator 31 has an upper end configured such that the electric field of VHF waves is at or near the minimum. The upper end of the resonator 31 is provided with a gas supply pipe for supplying the first gas. The gas supply pipe 35 is connected to the first gas source 28 via a gas line. The cover conductor 44, which is a top wall of the resonator 31, is configured to be the ground potential (shorted) during plasma ignition. Thus, since the electric field of VHF waves in the top wall (cover conductor 44) of the resonator 31 becomes zero or the minimum, abnormal discharge of the gas can be prevented even if a first gas supply port is provided in the top wall of the first dissociation space.

An antenna 25 exists within the first dissociation space (the resonator 31 and the space and a plurality of through-holes 38a are formed in the antenna 25. Since the electric field is increased in the antenna 25, the surface of the flange portion 22f is covered with a dielectric 38 such as an aluminum oxide to protect the antenna 25 and prevent metal contamination.

Referring to FIG. 7 illustrating a cross section taken along line in FIG. 6 and FIG. 8 which is an enlarged view of the introducer 2 of FIG. 6, there is a gap D between the outer periphery of the antenna 25 and an inner wall (inner surface of the first dissociation space (the resonator 31 and the space 30b)) of the introducer 2.

Further, since the gap D around the antenna 25 (flange portion 22f) alone leads to insufficient conductance during a flow of the first gas, the antenna 25 includes the plurality of through-holes 38a therein. The plurality of through-holes 38a are formed inward of the outer periphery of the antenna 25 and penetrate the dielectric 38 and the flange portion 22f. The plurality of through-holes 38a are provided at point-symmetric positions about an axial line AX. The plurality of through-holes 38a are evenly arranged in the circumferential direction.

The gap D and the plurality of through-holes 38a are provided to allow the first gas and radicals of the first gas to pass and diffuse therethrough and to control radiation characteristics and resonance characteristics of electromagnetic waves such as VHF waves. The flange portion 22f exposed to the plurality of through-holes 38a is at the ground potential and is configured to trap ions or electrons and to allow the passage of radicals.

The diameter of the through-holes 38a has a dimension of about $\lambda_0/50$ where $\lambda_0$ is a wavelength of a free space in a vacuum space. The total area of the plurality of through-holes 38a is ½ or less of a surface area of the antenna 25 in a horizontal direction of the flange portion 22f (perpendicular to the central axis of the chamber 10). Further, the plurality of through-holes 38a are arranged so as not to interfere with the outer periphery of the flange portion 22f Thus, the outer periphery of the flange portion 22f is formed in a circular shape, which makes it possible to control the radiation characteristics of VHF waves in a satisfactory manner.

As described above, according to the plasma processing apparatus 1 related to the second embodiment, the uniformity of a plasma process can be improved as in the plasma processing apparatus 1 according to the first embodiment. The first dissociation space (the resonator 31 and the space 30b) is provided as a plasma generation space upstream of the shower head 20, and the first gas is dissociated in the first dissociation space to generate radicals of the first gas. When the generated radicals pass through the shower head 20 and reach the second dissociation space 30e, some of them return to molecules and some of them become molecular radicals. However, since the first gas reaching the second dissociation space 30e is in a recombination excited state, the molecules and the molecular radicals can be re-dissociated into monoatomic radicals by energy of radio-frequency waves having a frequency lower than that of VHF waves. Further, the process gas or the like is supplied to the second dissociation space 30e through the shower head 20 by using a second gas path different from the first gas path for the first gas. The second gas is slightly dissociated in the second dissociation space 30e by energy of radio-frequency waves having a frequency lower than that of VHF waves. This makes it possible to improve the uniformity of a plasma process.

Further, in the plasma processing apparatus 1 according to the second embodiment, since the first gas is supplied from the upper end of the first dissociation space, there is an advantage that the distance from the first gas supply port to the shower head 20 can be increased and radicals of the first gas can be more easily diffused.

Modification of Second Embodiment

Figure 9:
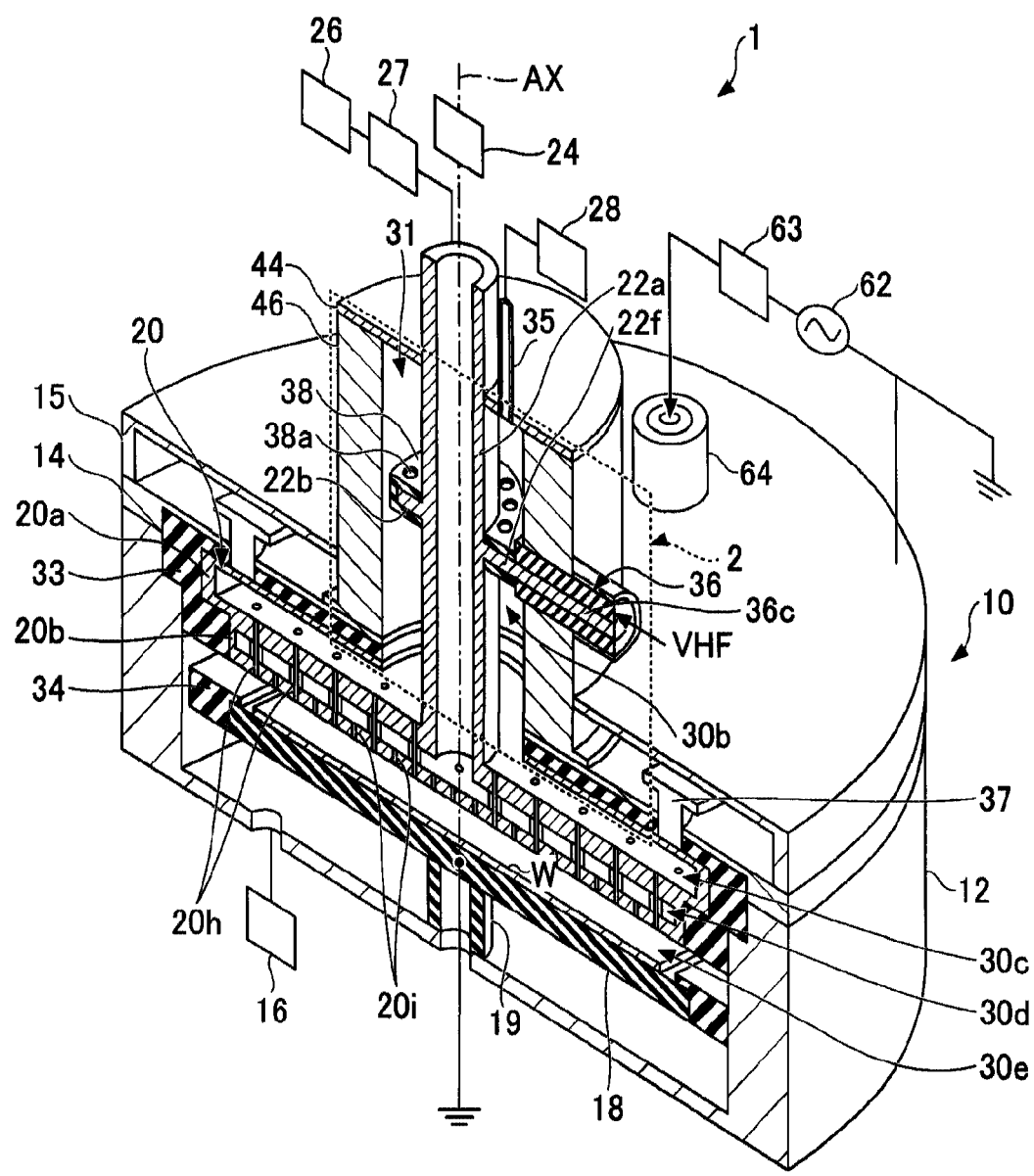
FIG. 9 is a cross-sectional perspective view illustrating Modification 1 of the plasma processing apparatus according to the second embodiment.
Figure 10:
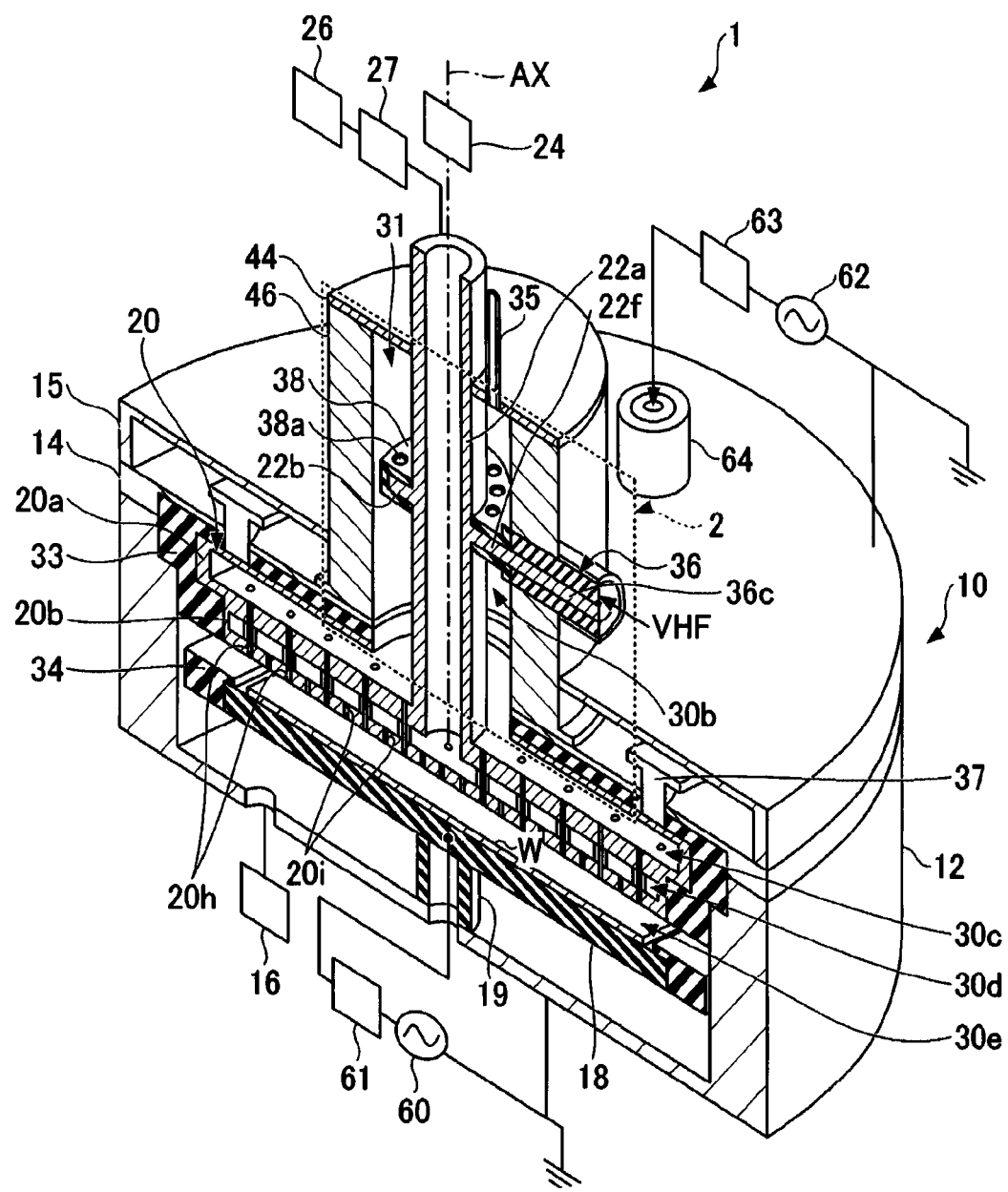
FIG. 10 is a cross-sectional perspective view illustrating Modification 2 of the plasma processing apparatus according to the second embodiment.

Next, Modifications 1 and 2 of the plasma processing apparatus 1 according to the second embodiment will be described with reference to FIGS. 9 and 10. FIG. 9 is a cross-sectional perspective view illustrating Modification 1 of the plasma processing apparatus 1 according to the second embodiment. FIG. 10 is a cross-sectional perspective view illustrating Modification 2 of the plasma processing apparatus 1 according to the second embodiment.

Modification 1 of Second Embodiment

The plasma processing apparatus 1 of Modification 1 illustrated in FIG. 9 differs from the plasma processing apparatus 1 illustrated in FIG. 6 in that radio frequency power is applied to the shower head 20 and the substrate supporter 18 is at the ground potential. In Modification 1, the substrate supporter 18 is not connected to the radio-frequency power supply 60, but is connected to the ground.

Further, the plasma processing apparatus 1 of Modification 1 is provided with the disk-shaped connector 15 having a hollow structure above the top wall 14 of the chamber 10. The introducer 2 passes through the connector 15 and is fixed to the top wall 14. The junction 37, which comes into contact with the shower head 20, is provided within the connector 15.

The radio-frequency power supply 62 passes through the interior of the upper connector 64 of the connector 15 via the matcher 63 and is connected to the shower head 20 via the junction 37. Thus, radio-frequency waves having a frequency lower than that of VHF waves are applied to the shower head 20 via the junction 37. The outer periphery of the shower head 20 excluding the lower surface is covered with the dielectric member 33. Other configurations are the same as those of the plasma processing apparatus 1 illustrated in FIG. 6.

Modification 2 of Second Embodiment

The plasma processing apparatus 1 of Modification 2 illustrated in FIG. 10 differs from the plasma processing apparatus 1 of Modification 1 illustrated in FIG. 9 in that radio frequency power is applied to both the shower head 20 and the substrate supporter 18. In Modification 2, the radio-frequency power supply 60 is connected to the substrate supporter 18 via the matcher 61.

Further, the radio-frequency power supply 62 is connected to the shower head 20 via the matcher 63 and the junction 37. Thus, radio-frequency waves having a frequency lower than that of VHF waves are applied to the substrate supporter 18 and the shower head 20.

Even according to Modifications 1 and 2 of the plasma processing apparatus 1 related to the second embodiment, plasma of the first gas is generated in advance in the first dissociation space 30b (the resonator 31 and the space 30b), and radicals of the first gas in a recombination excited state reach the second dissociation space 30e. This makes it possible to dissociate the first gas in the second dissociation space 30e even by radio-frequency waves having a frequency lower than that of VHF waves, and also slightly dissociate the second gas. Thus, the uniformity of a plasma process can be improved.

In the above, the plasma processing apparatuses 1 according to the first and second embodiments and the modifications thereof have been described. The plasma processing apparatuses 1 according to the first and second embodiments and the modifications thereof may function as an ALD apparatus. In an ALD process, it is necessary to alternately supply the first gas and the second gas and to replace the first gas and the second gas existing in the interior or upstream of the shower head 20 at respective On/Off timings. In other words, there is a wide range to replace the gases including not only a process space (the second dissociation space 30e) but also the interior of the shower head 20 and the interiors of the introducer 2 and the gas supply pipe existing upstream of the shower head 20. However, in the plasma processing apparatuses 1 according to the first and second embodiments and the modifications thereof, the gap of the process space (the second dissociation space 30e) is as narrow as about 3 to 30 mm. In contrast, in a case of a CVD apparatus, the gap of the process space between the shower head 20 and the substrate supporter 18 is as wide as about 30 mm.

From the above, when the plasma processing apparatuses 1 according to the first and second embodiments and the modifications thereof are used as an ALD apparatus, gas replacement can be performed quickly due to the narrow process space. Additionally, in the plasma processing apparatuses 1 according to the first and second embodiments and the modifications thereof, the first dissociation space and the diffusion space (the first diffusion chamber 30c and the second diffusion chamber 30d) within the shower head 20 are also narrow, so that the entire apparatus can also be made compact. Further, the first gas is dissociated by the frequency of VHF or higher and is uniformly supplied to the process space (the second dissociation space 30e) through the shower head 20. Thus, a process space with a short gap can be implemented without being affected by non-uniformity caused by antinodes or nodes of electromagnetic waves which become apparent when a frequency of VHF or higher is used. This makes it possible to quickly perform the gas replacement, increase the throughput, and improve the uniformity of a plasma process.

The plasma processing apparatuses according to the embodiments disclosed herein should be considered to be exemplary and not limitative in all respects. The embodiments may be modified and improved in various forms without departing from the scope of the appended claims and their gist. The matters described in the aforementioned embodiments may have other configurations to the extent that they are not contradictory, and may be combined to the extent that they are not contradictory.

In addition, the first dissociation space requires high-energy electrons for gas dissociation, and may use a frequency of VHF or higher. Further, the first dissociation space may be as close as possible to the second dissociation space which is a process space. As for the structure, a pre-activation function (contributing to film formation) and a remote cleaning function in the introducer 2 having the first dissociation space may be provided by separate suppliers from the viewpoint of contamination and particles. In other words, in the plasma processing apparatuses according to the embodiments, a reducing gas supplier and a cleaning gas supplier in the introducer 2 are separate systems, which makes it possible to prevent contamination and particle generation. A high-bond-energy molecular gas such as a $N_2$ gas, which is difficult to be dissociated by RF waves alone, can be dissociated by the pre-activation function in the first dissociation space and then sent to the second dissociation space, and the high-bond-energy molecular gas can be dissociated in the second dissociation space by application of the RF waves.

This application claims priority based on Japanese Patent Application No. 2020-211851 filed with the Japan Patent Office on Dec. 21, 2020, and the entire contents thereof are incorporated herein by reference.

EXPLANATION OF REFERENCE NUMERALS

1: plasma processing apparatus, 2: introducer, 10: chamber, 18: substrate supporter, 20: shower head, 22: gas supply pipe, 22f: flange portion, 25: antenna, 30b: first dissociation space, 30c: first diffusion chamber, 30d: second diffusion chamber, 30e: second dissociation space, 31: resonator, 32: partition plate, 36: supply path, 36c: conductor, 50: VHF power supply

What is claimed is:

1. A plasma processing apparatus comprising:
a chamber;
a substrate supporter provided within the chamber and on which a substrate as a processing target is placed;
a shower head formed of a metal and including a plurality of gas holes provided to be open toward an internal space of the chamber, the shower head being provided above the substrate supporter;
a gas supply pipe formed of a metal and extending vertically above the chamber to be connected to an upper center of the shower head;
an introducer through which the gas supply pipe passes above the chamber and into which an electromagnetic wave of a VHF or higher is introduced to activate a gas; and
an electromagnetic-wave supply path connected to the gas supply pipe,
wherein the introducer has a first dissociation space arranged upstream of the shower head, and a first gas is supplied to the first dissociation space to be dissociated in the first dissociation space by the electromagnetic wave,
wherein the chamber has a second dissociation space which is a process space between the substrate supporter and the shower head, the first gas dissociated in the first dissociation space and a second gas from the gas supply pipe are joined in the second dissociation space downstream of the shower head, and the first gas and the second gas are dissociated in the second dissociation space by a radio-frequency wave having a frequency lower than a frequency of the electromagnetic wave,
wherein a cross-sectional shape of the first dissociation space is a substantially cylindrical shape, and
wherein a diameter of the substantially cylindrical shape of the first dissociation space is smaller than $\lambda g/6$ where $\lambda g$ is an effective wavelength of the electromagnetic wave in vacuum.

2. The plasma processing apparatus of claim 1, wherein the first dissociation space is provided in an interior of a resonator configured to transmit the electromagnetic wave and/or at a side closer to the shower head than the resonator.

3. The plasma processing apparatus of claim 2, wherein the gas supply pipe passes through the interior of the resonator and functions as a pipe that supplies the second gas or a pipe for remote plasma.

4. The plasma processing apparatus of claim 3, wherein the first dissociation space is provided between the resonator and the shower head, and
wherein the introducer includes a partition plate made of a dielectric that partitions between the resonator and the first dissociation space.

5. The plasma processing apparatus of claim 4, wherein a vertical distance between a ceiling surface and a bottom surface of a first diffusion chamber inside the shower head is within 10 times a skin depth.

6. The plasma processing apparatus of claim 5, wherein a reducing gas as the first gas is dissociated in the first dissociation space.

7. The plasma processing apparatus of claim 6, wherein a gap between the shower head and the substrate supporter which define the second dissociation space is 3 mm to 30 mm.

8. The plasma processing apparatus of claim 7, wherein a path through which the first gas is supplied from the first dissociation space to the second dissociation space via a first gas hole of the shower head, and a path through which the second gas is supplied from the gas supply pipe to the second dissociation space via a second gas hole of the shower head are different from each other.

9. The plasma processing apparatus of claim 8, wherein radio frequency power is applied to at least one of the shower head and the substrate supporter.

10. The plasma processing apparatus of claim 9, wherein an antenna exists within the first dissociation space, and
wherein a plurality of through-holes are formed in the antenna.

11. The plasma processing apparatus of claim 10, wherein the antenna includes a flange portion,
wherein the plurality of through-holes are formed in the flange portion, and
wherein a total area of the plurality of through-holes is ½ or less of a surface area of the flange portion in a horizontal direction perpendicular to a central axis of the chamber.

12. The plasma processing apparatus of claim 11, wherein the plurality of through-holes are formed inward of an outer periphery of the flange portion.

13. The plasma processing apparatus of claim 12, wherein a gap is provided between the outer periphery of the flange portion and an inner wall of the introducer.

14. The plasma processing apparatus of claim 13, wherein outer peripheries of the shower head and the substrate supporter are covered with a member of a dielectric.

15. The plasma processing apparatus of claim 2, wherein the interior of the resonator is at an ambient atmosphere, and the first dissociation space is at a vacuum pressure, and
wherein the first dissociation space is provided at the side closer to the shower head than the resonator and is a space for generation of plasma.

16. The plasma processing apparatus of claim 2, wherein a dielectric is embedded in the resonator.

17. The plasma processing apparatus of claim 2, wherein the interior of the resonator is at a vacuum pressure and is the first dissociation space for generation of plasma.

18. The plasma processing apparatus of claim 2, wherein the resonator includes a top wall configured such that an electric field of the electromagnetic wave is at or near a minimum, and
  wherein the top wall of the resonator is provided with a gas supply pipe that supplies the first gas.

19. The plasma processing apparatus of claim 1, wherein a vertical distance between a ceiling surface and a bottom surface of a first diffusion chamber inside the shower head is within 10 times a skin depth.

20. The plasma processing apparatus of claim 1, wherein a reducing gas as the first gas is dissociated in the first dissociation space.

* * * * *